United States Patent
Bayram et al.

(10) Patent No.: US 10,027,086 B2
(45) Date of Patent: Jul. 17, 2018

(54) MAXIMIZING CUBIC PHASE GROUP III-NITRIDE ON PATTERNED SILICON

(71) Applicant: The Board of Trustees of the University of Illinois, Urbana, IL (US)

(72) Inventors: Can Bayram, Urbana, IL (US); Richard Liu, Champaign, IL (US)

(73) Assignee: Board of Trustees of the University of Illinois, Urbana, IL (US)

(*) Notice: Subject to any disclaimer, the term of this patent is extended or adjusted under 35 U.S.C. 154(b) by 0 days.

(21) Appl. No.: 15/490,528

(22) Filed: Apr. 18, 2017

(65) Prior Publication Data

US 2017/0310076 A1    Oct. 26, 2017

Related U.S. Application Data

(60) Provisional application No. 62/325,659, filed on Apr. 21, 2016.

(51) Int. Cl.
*H01S 5/00* (2006.01)
*H01S 5/02* (2006.01)
(Continued)

(52) U.S. Cl.
CPC ............ *H01S 5/0207* (2013.01); *H01S 5/021* (2013.01); *H01S 5/3013* (2013.01); *H01S 5/3031* (2013.01); *H01S 5/32341* (2013.01); *H01L 29/2003* (2013.01); *H01L 31/03044* (2013.01); *H01L 33/32* (2013.01);
(Continued)

(58) Field of Classification Search
CPC .... H01S 5/0207; H01S 5/021; H01S 5/32341; H01S 5/3031; H01S 5/3013; H01S 2304/00; H01S 2304/04; H01S 2301/173
See application file for complete search history.

(56) References Cited

U.S. PATENT DOCUMENTS

| 5,824,186 A | * 10/1998 | Smith ................... G02F 1/1362 438/597 |
| 8,927,398 B2 | 1/2015 | Bayram et al. |

(Continued)

OTHER PUBLICATIONS

Durniak et al., "Green Emitting Cubic GaInN/GaN Quantum Well Stripes on Micropatterned Si(001) and Their Strain Analysis," Advanced Electronic Materials, pp. 1-8, Jan. 2016.

(Continued)

*Primary Examiner* — Kinam Park
(74) *Attorney, Agent, or Firm* — Lowenstein Sandler LLP

(57) ABSTRACT

A device including a non-polarization material includes a number of layers. A first layer of silicon (100) defines a U-shaped groove having a bottom portion (100) and silicon sidewalls (111) at an angle to the bottom portion (100). A second layer of a patterned dielectric on top of the silicon (100) defines vertical sidewalls of the U-shaped groove. A third layer of a buffer covers the first layer and the second layer. A fourth layer of gallium nitride is deposited on the buffer within the U-shaped groove, the fourth layer including cubic gallium nitride (c-GaN) formed at merged growth fronts of hexagonal gallium nitride (h-GaN) that extend from the silicon sidewalls (111), wherein a deposition thickness (h) of the gallium nitride above the first layer of silicon (100) is such that the c-GaN completely covers the h-GaN between the vertical sidewalls.

11 Claims, 12 Drawing Sheets

(51) Int. Cl.
| | |
|---|---|
| H01S 5/323 | (2006.01) |
| H01S 5/30 | (2006.01) |
| H01L 29/20 | (2006.01) |
| H01L 31/0304 | (2006.01) |
| H01L 33/32 | (2010.01) |

(52) U.S. Cl.
CPC ..... *H01S 2301/173* (2013.01); *H01S 2304/00* (2013.01); *H01S 2304/04* (2013.01)

(56) References Cited

U.S. PATENT DOCUMENTS

| | | | | |
|---|---|---|---|---|
| 9,048,173 | B2 | 6/2015 | Bayram et al. | |
| 9,153,431 | B1 | 10/2015 | Lee et al. | |
| 2009/0127583 | A1* | 5/2009 | Ohachi | B82Y 20/00 257/190 |
| 2013/0069107 | A1* | 3/2013 | Nozaki | H01L 33/22 257/103 |
| 2015/0108427 | A1* | 4/2015 | Brueck | H01L 21/02381 257/14 |
| 2017/0194476 | A1* | 7/2017 | Brueck | H01L 21/02381 |

OTHER PUBLICATIONS

Morkoc, "Handbook of Nitride Semiconductors and Devices," Wiley, Weinheim, 1316 pages, May 5, 2008.
Leung et al., "Analysis of Channel Confined Selective Area Growth in Evolutionary Growth of GaN on SiO2 (100)," Journal of Crystal Growth, vol. 426, pp. 95-102, Sep. 2015.
Liu et al., "Maximizing Cubic Phase Gallium Nitride Surface Coverage on Nano-Patterned Silicon," Applied Physics Letters, 5 pages, Jul. 2016.
Bayram et al., "Cubic Phase GaN on Nano-grooved Si (100) via Maskless Selective Area Epitaxy," Advanced Functional Materials, vol. 24, Issue 28, pp. 4492-4496, Jul. 2014.
Stark et al., "Green Cubic GaInN/GaN Light-Emitting Diode on Microstructured Silicon (100)," Applied Physics Letters, vol. 103, Issue 23, 5 pages, Dec. 2013.
Liu et al., "Cathodoluminescence Study of Luminescence Centers in Hexagonal and Cubic Phase GaN Hetero-Integrated on Si(100)," Journal of Applied Physics, vol. 120, 7 pages, Jul. 2016.
As, "Cubic Group-III Nitride-Based Nanostructures—Basics and Applications in Optoelectronics," Microelectronics Journal, vol. 40, Issue 2, pp. 204-209, Feb. 2009.
Kitamura et al., "Optical Properties of Cubic InGaN/GaN Multiple Quantum Wells on 3C-SiC Substrates by Radio-Frequency Plasma-Assisted Molecular Beam Epitaxy," Physica Status Solidi (A), Applied Research, vol. 188, Issue 2, pp. 705-709, Nov. 2001.
Granzner et al., "Vertical Design of Cubic GaN-Based High Electron Mobility Transistors," Journal of Applied Physics, vol. 110, Issue 11, 9 pages, Dec. 2011.
Buß et al., "High Temperature Electron Spin Dynamics in Bulk Cubic GaN: Nanosecond Spin Lifetimes Far Above Room-Temperature," Applied Physics Letter, vol. 105, Oct. 2014.
Lee et al., "Orientation-Dependent Nucleation of GaN on a Nanoscale Faceted Si Surface," Journal of Crystal Growth, 279, pp. 289-292, Apr. 2005.
Schroder et al., "Convex Corner Undercutting of {100} Silicon in Anisotropic KOH Etching: The New Step-Flow Model of 3-D Structuring and First Simulation Results," Journal of Microelectromechanical Systems, vol. 10, No. 1, pp. 88-97, Mar. 2001.
Kanaya et al., "Penetration and Energy-Loss Theory of Electrons in Solid Targets," Journal Phys. D; Appl. Phys., vol. 5, 17 pages, 1972.
Reshchikov, "Photoluminescence from Structural Defects in GaN," Physica B, vol. 340-342, pp. 440-443, Dec. 2003.
Azuhata et al., "Polarized Raman Spectra in GaN," Journal of Physics: Condensed Matter, vol. 7, pp. L0129-L0133, Mar. 1995.
Wu et al., "Photoluminescence Properties of Cubic GaN Grown on GaAs(100) Substrates by Metalorganic Vapor Phase Epitaxy," Applied Physics Letters, vol. 71, pp. 2067-2070, Aug. 13, 1997.
Wang et al., "Cathodoluminescence of Homogeneous Cubic GaN/GaAs(001) Layers," Semiconductor Science and Technology, vol. 14, No. 2, 8 pages, Nov. 1998.
Glaser et al., "Optically Detected Magnetic Resonance of Effective-Mass Shallow Acceptors in Si-Doped GaN Homoepitaxial Layers," Physical Review B 68, pp. 195201-1 through 195201-6, Jun. 2003.
As et al., "The Near Band Edge Photoluminescence of Cubic GaN Epilayers," Applied Physics Letters, vol. 70, 4 pages, Jan. 1997.
Okumarah, "Arsenic Surfactant Effects and Arsenic Mediated Molecular Beam Epitaxial Growth for Cubic GaN," Applied Physics Letters, vol. 72, No. 23, 4 pages, Jun. 8, 1998.
Menniger et al., "Optical Transitions in Cubic Gan Investigated by Spatially Resolved Cathodoluminescence," 4 pages, May 1996.
Reshchikov et al., "Luminescence Properties of Defects in GaN," Journal of Applied Physics, vol. 97, Issue 6, 96 pages, Jan. 2005.
Zhang et al., "Photoluminescence of Carbon in Situ Doped GaN Grown by Halide Vapor Phase Epitaxy," Applied Physics Letters, vol. 72, No. 13, 4 pages, Mar. 1998.
Varshni, "Temperature Dependence of the Energy Gap in Semiconductors," Physica 34, pp. 149-154, 1967.
Dingle et al., "Absorption, Reflectance, and Luminescence of GaN Epitaxial Layers," Physical Review B, vol. 4, No. 4, pp. 1211-1218, Aug. 1971.
Ramirez-Flores et al., "Temperature-dependent Optical Band Gap of the Metastable Zinc-Blende Structure β-GaN," Physical Review B, vol. 50, No. 12, pp. 8433-8438, Sep. 1994.
Teisseyre et al., "Temperature Dependence of the Energy Gap in GaN Bulk Single Crystals and Epitaxial Layer," Journal of Applied Physics, vol. 76, pp. 2429-2434, Apr. 20, 1994.
Yacobi et al., "Cathodoluminescence Scanning Electron Microscopy of Semiconductors," Journal of Applied Physics, vol. 59, No. 4, 25 pages, Feb. 15, 1966.
Rouabah, "Electron Range-Energy Relationships for Calculating Backscattering Coefficients in Elemental and Compound Semiconductors," Solid State Communications 151, pp. 838-841, Apr. 2011.
Dingle et al., "Donor-Acceptor Pair Recombination in GaN," Solid State Commuincations, vol. 9, pp. 175-180, pp. 175-180, Oct. 15, 1979.
Schikora et al., "Epitaxial Growth and Optical Transitions of Cubic GaN Films," Physical Review B, vol. 54, No. 12, pp. R8381-R8385, Sep. 1996.
Holst et al., "Mechanisms of Optical Gain in Cubic Gallium Nitrite," Applied Physics Letters, vol. 72, No. 12, pp. 1439-1442, Mar. 1998.
Menniger et al., "Identification of Optical Transitions in Cubic and Hexagonal GaN by Spatially Resolved Cathodoluminescence," Physical Review B, vol. 53, No. 4, pp. 1881-1885, Jan. 1996.
Shur, "Deep-Ultraviolet Light-Emitting Diodes," IEEE Transactions on Electron Devices, vol. 57, No. 1, pp. 12-25, Jan. 2010.
Oto et al., "100 mW Deep-Ultraviolet Emission from Aluminium-Nitride-Based Quantum Wells Pumped by an Electron Beam," Nature Photonics, vol. 4, pp. 767-771, Sep. 2010.
Verzellesi et al., "Efficiency Droop in InGaN/GaN Blue Light-Emitting Diodes: Physical Mechanisms and Remedies," Journal of Applied Physics, vol. 114, 15 pages, Aug. 2013.
Cho et al., "Efficiency Droop in Light-Emitting Diodes: Challenges and Countermeasures," Laser Photonics Rev., 7, No. 3, pp. 408-421, Jan. 2013.
Meyaard et al., "Identifying the Cause of the Efficiency Droop in GaInN Light-Emitting Diodes by Correlating the Onset of High Injection with the Onset of the Efficiency Droop," Applied Physics Letter, vol. 102, pp. 251114-1 through 251114-4, Jan. 2013.
Karpov, "ABC-Model for Interpretation of Internal Quantum Efficiency and Its Droop in III-Nitride LEDs: A Review," Optical and Quantum Electronics, vol. 47, Issue 6, pp. 1293-1303, Aug. 2014.
Weisbuch et al., "The Efficiency Challenge of Nitride Light-Emitting Diodes for Lighting," Physica Status Solidi A 212, No. 5, , pp. 899-913, Jan. 2015.
Kim et al., "Valence Subbands and Optical Gain in Wurtzite and Zinc-Blende Strained GaN/AlGaN Quantum Wells," Solid State Communications, vol. 106, No. 3, pp. 127-132, Dec. 1997.

(56) References Cited

OTHER PUBLICATIONS

Chitta et al., "Room temperature Ferromagnetism in Cubic GaN Epilayers Implanted with Mn+Ions," Chitta et al., Applied Physics Letters, vol. 85, No. 17, pp. 3777-3779, Oct. 2004.
Kako et al., "Single-Photon Emission from Cubic GaN Quantum Dots," Applied Physics Letters, vol. 104, 4 pages, Jan. 2014.
As et al., "Electroluminescence of a Cubic GaN/GaAs (001) p-n Junction," Applied Physics Letter, vol. 76, No. 1, pp. 12-15, Jan. 2000.
Chichibu et al., "Recombination Dynamics of Localized Excitons in Cubic InxGa1-xN/GaN Multiple Quantum Wells Grown by Radio Frequency Molecular Beam Epitaxy on 3C-Sic Substrate," Journal of Vacuum Science & Technology B: Microelectronics and Nanometer Structures Processing, Measurement and Phenomena 21, pp. 1856-1862, Aug. 2003.
Wei et al., "MOCVD Growth of Cubic GaN on 3C-SiC Deposited on Si (100) Substrates," Journal of Electronic Materials, vol. 29, No. 3, pp. 317-321, Oct. 1999.
Compean et al., "Bulk Lattice Parameter and Band Gap of Cubic InXGa1-xN (001) Alloys on Mg0(100) Substrates," Jouranl of Crystal Growth 418, pp. 120-125, Feb. 2015.
Dhara et al., "Hexagonal-to-Cubic Phase Transformation in GaN Nanowires by Ga+ Implantation," Applied Physics Letter vol. 84, No. 26, pp. 5473-5475, Jun. 2004.
Cui et al., "Cubic GaN Formation in Mn/GaN Multilayer Films Grown on 6H-SiC(0001)," Applied Physics Letters, vol. 82, No. 26, pp. 4666 to 4668, Jun. 2003.
Reuters et al., "Semi-polar {1101} Blue and Green InGaN/GaN Light-Emitting Diodes on Micro-Stripe Patterned Si (100)," Journal of Physics D: Applied Physics, vol. 48, pp. 1-9, Nov. 2015.

\* cited by examiner

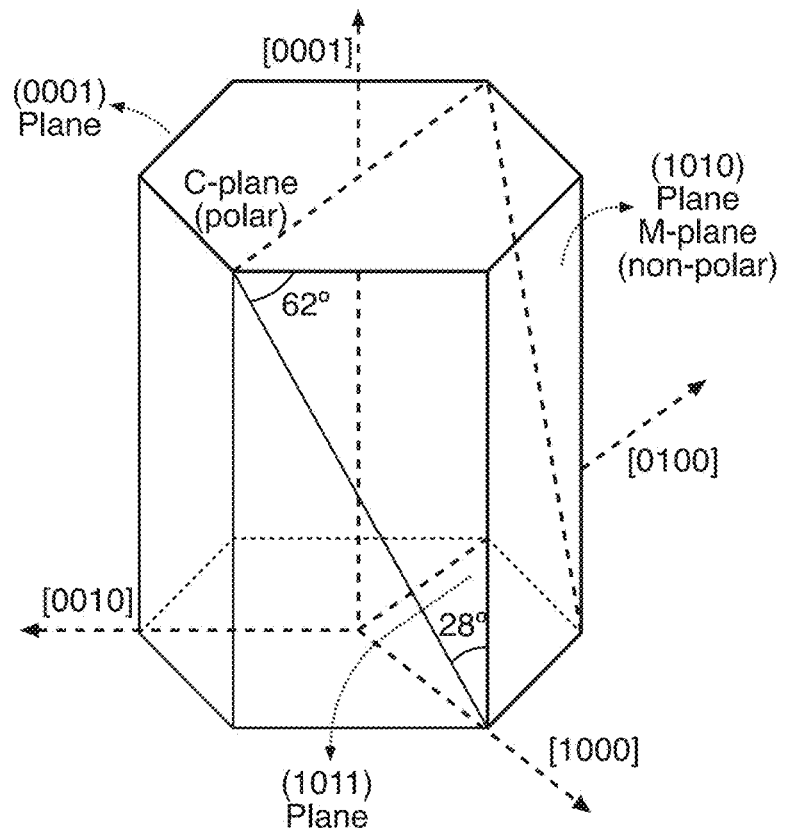
FIG. 3
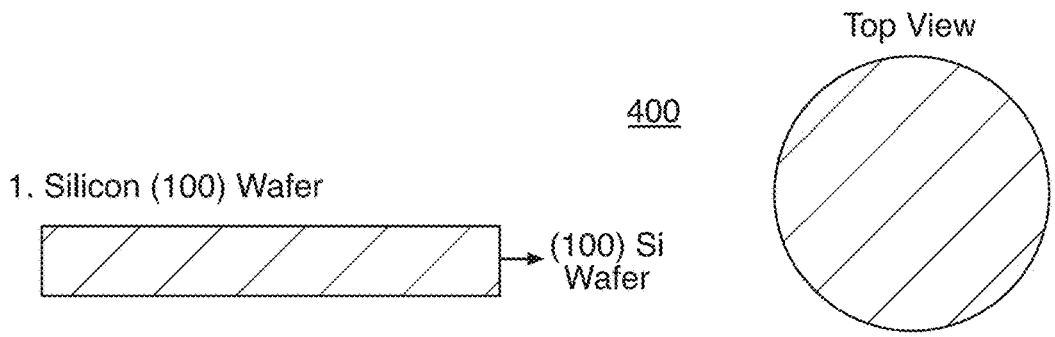
1. Silicon (100) Wafer
FIG. 4A
2. Dielectric #1 Deposition
FIG. 4B 3. Dielectric Patterning Top View 4. Silicon Patterning Critical Points A, B, C are Shown Zoomed In

MAXIMIZING CUBIC PHASE GROUP III-NITRIDE ON PATTERNED SILICON

REFERENCE TO EARLIER FILED APPLICATION

This application claims the benefit under 35 U.S.C. § 119(e) of U.S. Provisional Patent Application No. 62/325,659, filed Apr. 21, 2016, which is incorporated herein, in its entirety, by this reference.

BACKGROUND

Group III nitrides are composed of nitrogen (N) in combination with one or more of the periodic table Group III elements: aluminum (Al), gallium (Ga), and indium (In). There is substantial interest in Group III-nitride materials and devices due to applications in optoelectronics, portable consumer devices such as handheld projectors, high resolution televisions, displays, and lighting. Specifically, Group III-nitride laser diodes are demanded for many portable consumer devices such as handheld projectors, high resolution televisions, displays, and lighting.

Major challenges, however, exist in manufacturing GaN-based laser diodes such as (1) material defects ($\sim 10^9/cm^2$), (2) intrinsic polarization fields ($\sim$MV/cm), and (3) non-ideal cavity mirror formation due to lack of cleavage planes. As GaN epitaxy is grown on highly lattice-mismatched substrates such as sapphire, silicon, or silicon carbide (SiC), there is a twist and asymmetry between the substrate and the GaN regrowth leading to a high incidence of material defects. Accordingly, processing employs either dry etching or polishing to form the mirrors due to the high incidence of material defects.

Polarization is the inherent non-centrosymmetric characteristic of GaN crystal. Along the common growth direction of <0001>, wurtzite (e.g., hexagonal) phase GaN material is inherently polar, which degrades the recombination characteristics in lasers because of the lack of efficiency of recombination across non-aligned electron and hole wavefunctions. Nonpolar GaN freestanding substrates are available, which may address the above issues, but high costs make this option unworkable. A disadvantage with laser diodes using non-polar surfaces is the difficulty in obtaining non-polar GaN substrates (such as m-plane discussed below). Cutting a non-polar GaN substrate requires consuming a two-inch piece of polar GaN, with a value of about $10,000, and the area of the cut GaN substrate is quite small. Currently, the area is about 3 mm to 5 mm, and no larger than about 10 mm. What is desired, therefore, is a mass-producible, cost-effective approach that eliminates piezo-electricity effects in GaN and other Group III-nitrides.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 3 is a perspective view of a Group III-nitride material through which various planes may be cut onto which to form the disclosed devices, according to embodiments of the present disclosure.

FIGS. 4A, 4B, 4C, 4D, 4E, and 4F are processing step diagrams illustrating a method for manufacturing a Group III-nitride device, according to embodiments of the present disclosure.

DETAILED DESCRIPTION

Figure 1:
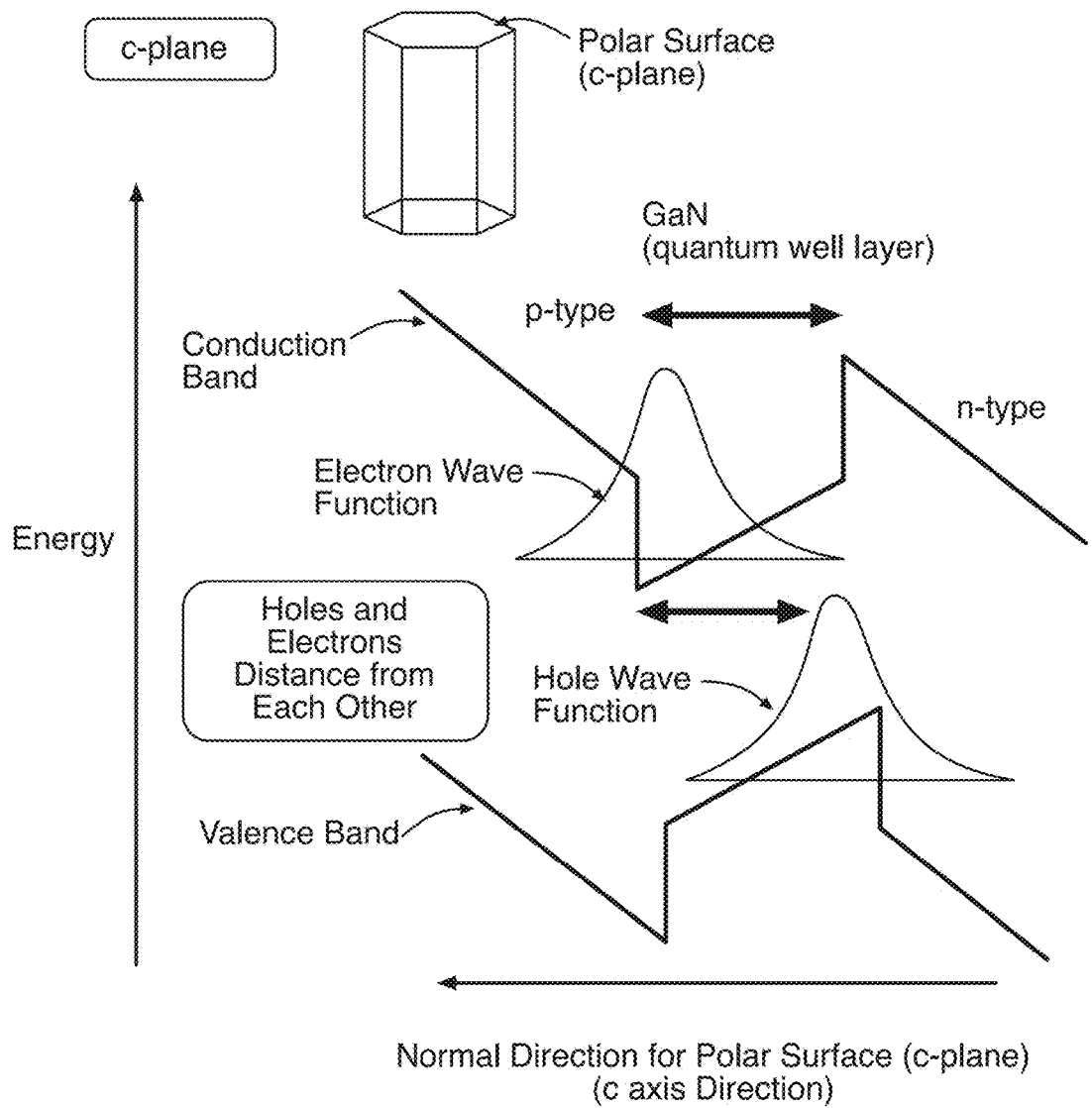
FIG. 1 is a set of graphs illustrating issues with polar planes that are present in some existing materials, according to embodiments of the present disclosure.

By way of introduction, the present disclosure introduces polarization free, low-defecivity Group-III nitride-based devices and methods of making them, which provide a low-cost alternative to use of the above-mentioned nonpolar GaN freestanding substrates. While a gallium nitride (GaN) material in the devices may be referenced, this is by way of example only and each discussion may equally apply to any Group-III nitride or other material that includes both a hexagonal and a cubic phase of the material.

Thanks to their direct bandgap across the entire visible spectrum and ultra violet, gallium nitride (GaN) semiconductors and its compounds (e.g., with aluminum and/or indium) have transformed the visible light emitting diode (LED) industry and are now being explored for radio frequency (RF) power transistors and the like Almost without exception, light emitting diodes (LEDs) and other kinds of GaN devices (including RF power transistors) are grown on three-fold or six-fold symmetry surfaces (e.g., $Al_2O_3$, SiC, and Si (111) substrates) due to phase stability. The resulting GaN is therefore the six-fold symmetric hexagonal phase (wurtzite) GaN (h-GaN). The non-centrosymmetric nature (e.g., gallium and nitrogen atoms are not interchangeable in the lattice) of the hexagonal crystal arrangement leads to residual spontaneous and piezoelectric polarization fields. Both these polarization fields are along the <0001> growth direction, which is also the carrier injection direction in vertical transport devices, such as LEDs, lasers, and detectors, and thus are detrimental to recombination dynamics and device efficiency.

On the other hand, cubic phase (zincblende) GaN (c-GaN) does not possess these polarization fields. Other advantages of c-GaN in photonic devices include cleavage planes and a higher optical gain. As such, there exists a need for a reliable approach for fabricating c-GaN for applications ranging from polarization-free photonics, normally off transistors, room-temperature ferromagnetism, high-temperature spintronics, and single photon emitters. Yet, c-GaN is one of the least studied materials due to its phase instability and tendency to revert to the more stable h-GaN.

The present disclosure provides a solution to the above-noted problems by changing the material phase, from hexagonal to cubic, addressing the polarization effects, rather than using the conventional crystal cut approach. The present method uses selective area growth of GaN on buffered, patterned silicon coated with a dielectric. In various embodiments, the disclosed growth technique results in complete surface coverage of c-GaN by way of deliberate deposition of a pre-determined amount of GaN, e.g., a GaN deposited to a preset thickness within a U-shaped groove etched into silicon (or other appropriate substrate). Accordingly, the disclosed structure is manufactured with a cubic phase GaN (c-GaN) via silicon (100) nano-patterning. Furthermore, four nano-patterning dimensions, including 1) opening width of the U-shape, 2) etch depth of the silicon, 3) dielectric sidewall slope, and 4) growth thickness (e.g., height), are correlated in a way so as to provide maximum c-GaN coverage.

Benefits of the disclosed cubic phase growth in device manufacturing include the ability to integrate Group III nitride materials, such as GaN, with Si complementary metal-oxide semiconductor (CMOS) materials, which are prevalent and cost effective. Silicon devices are commonly fabricated on Si (100) substrates. Si (100) is one such substrate of interest due to possible integration of GaN devices with Si electronics, although other materials can be used, such as materials that are compatible with GaN growth epitaxy, e.g., silicon nitride (SiN). Growth of GaN on Si (100), however, leads to polycrystalline structures with very rough surfaces consisting of many grains. The reason for this is the fourfold symmetry and the possibility for GaN with its six-fold symmetry to be grown with two preferred rotational alignments on this surface. For such c-axis oriented material, the lattice mismatch is anisotropic and yields ~15% for <11$\bar{2}$0>||Si<$\bar{1}$00> and 0.7% for <10$\bar{1}$0>||Si<$\bar{1}$00>. While these mismatch values are lower than for Si (111), the material quality is low due to twist boundaries. Overall, GaN on Si (100) leads to twist boundaries and low quality material.

More specifically, because the crystallographic geometry of h-crystal in the <0001> direction and c-crystal in the <111> direction are equivalent, if two h-phase <0001> growth fronts merge at an angle of 109.5° (e.g., the angle between the two Ga—N bonds in the tetrahedral bonding), cubic phase forms after the seam between the two growth fronts. Anisotropic nano-patterning of Si (100) substrates may be used to create U-shaped grooves with a crystallographic angle of 54.74° between the Si (100) and Si (111) surfaces. Thus, GaN selective metalorganic chemical vapor deposition (MOCVD)-growth on Si (111) silicon sidewalls of a U-groove leads to two h-GaN growth fronts meeting at an angle of 54.74°×2≈109.5°, which is the angle that facilitates the transition of the h-GaN into c-GaN after coalescence (or seam). This coalescence (or seam) forms when the two h-GaN growth fronts meet.

Some practical applications of this technology involve localized GaN devices. As the transistor technology is within tens of nanometers, it is indeed feasible to use such localized epitaxial high quality materials for GaN sub-micron transistors. The disclosed GaN-based devices may be integrated within GaN photonics using silicon electronics, according to various embodiments. Moreover, such GaN/Si technology offers excellent waveguides and enables GaN-on-Si photonics as a natural cleavage plane occurring for cubic phase GaN on Si (100). In this respect, the implications of the localized GaN-on-Si epitaxy results are diverse and very motivating for GaN—Si community, ranging from visible LEDs, laser diodes, and existing transistors.

FIG. 1 is a set of graphs illustrating issues with polar planes that are present in some existing materials such as GaN, for example. As illustrated, when GaN is grown off of a polar surface (c-plane) of a material, it is known as hexagonal GaN or h-GaN. Hexagonal GaN is polar electrical, so when an electrical field is applied, there is a physical deformation within the material. This physical deformation extends the distance between electrons (within the quantum well layer) and holes (within the valence band), which reduces recombination efficiency of the electrons and holes.

Figure 2:
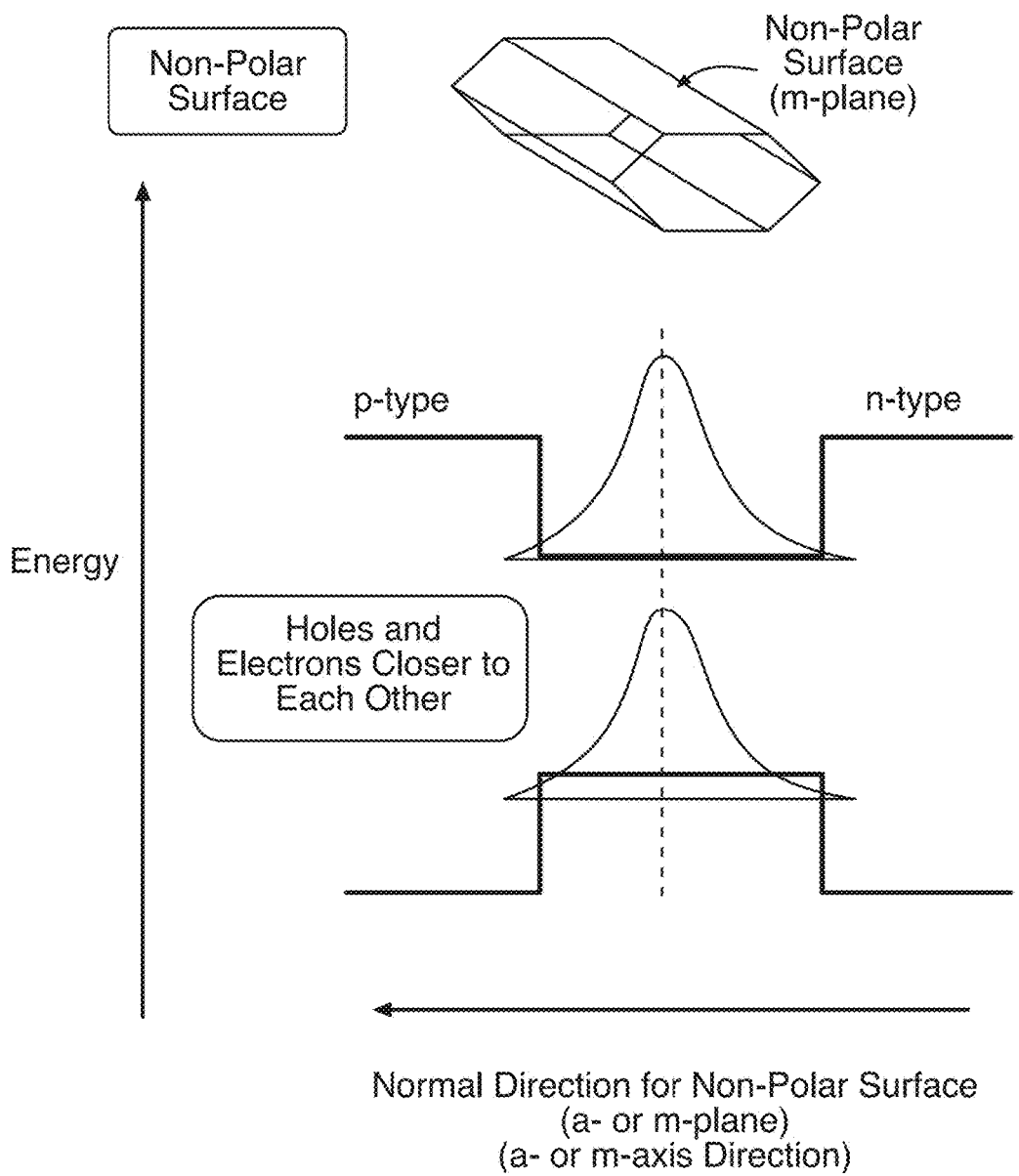
FIG. 2 is a set of graphs illustrating a solution using nonpolar planes within some existing materials, according to embodiments of the present disclosure.

FIG. 2 is a set of graphs illustrating a solution using polar planes within some existing materials, for example, GaN. When the GaN is rotated 90 degrees, a cut surface along the sidewalls exposes nonpolar cubic GaN (or c-GaN) and resembles an m-plane. In this case, an electrical field does not affect the alignment between the electrons and holes, as illustrated. This overcomes the problem in FIG. 1 because the electrons in the quantum well layer and the holes in the valence band are now aligned, producing fast charge carriers and a resultant efficient recombination of electrons and holes. FIG. 2, therefore, illustrates the need for polarization free materials (like c-GaN) in optical devices like LEDs, lasers, detectors, and in transistors, and the like, which rely on efficient recombination for acceptable speed.

FIG. 3 is a perspective view of a Group III-nitride material through which various planes may be cut onto which to form the disclosed devices, according to embodiments of the present disclosure. One issue with laser diodes using nonpolar surfaces, however, is the difficulty in obtaining nonpolar GaN substrates (such as m-plane shown in FIG. 3.) Cutting a nonpolar GaN substrate requires consuming a two-inch piece of polar GaN, with a value of about $10,000, and the area of the cut GaN substrate is quite small. Currently, the area is about 3 mm to 5 mm, and no larger than about 10 mm. It is desired, therefore, to develop a mass producible, cost effective approach that eliminates piezoelectricity effects in GaN. In this respect, the present method is provided that changes the material phase, from hexagonal to cubic, addressing the polarization effects in lieu of the conventional crystal cut approach.

Figure 4C:
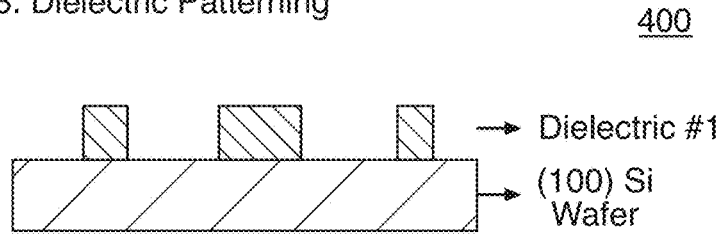
Figure 4C:
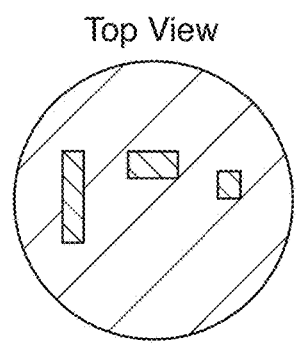

FIGS. 4A, 4B, 4C, 4D, 4E, and 4F are processing step diagrams illustrating a method 400 for manufacturing of a Group III-nitride device, according to embodiments of the present disclosure. As illustrated in FIG. 4A, the method 400 may begin with a substrate such as silicon (100) (Si), although other substrates are also suitable as would be apparent to one of skill in the art. As illustrated in FIG. 4B, the method 400 may continue with a dielectric layer (such as silicon dioxide or other suitable dielectric) being deposited on top of the silicon (100). As illustrated in FIG. 4C, the method 400 may continue with the dielectric layer being patterned into a desired shape, e.g., for location of U-shaped grooves, forming a part of a disclosed device.

Figure 4D:
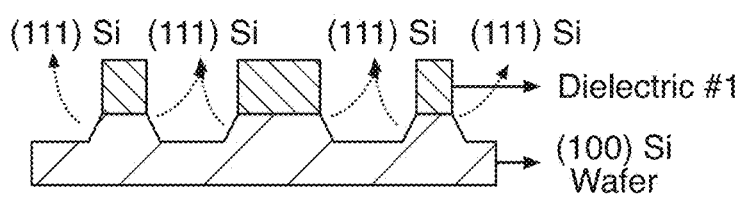
Figure 4D:
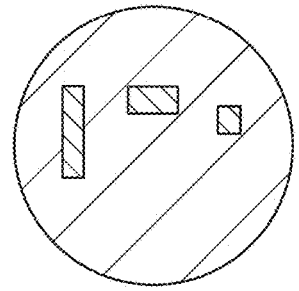
Figure 4E:
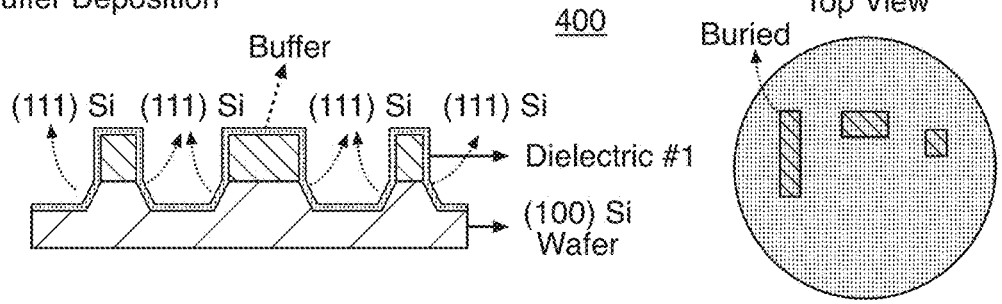

As illustrated in FIG. 4D, the method 400 may continue with etching the silicon (100) exposed under the patterned dielectric. The etching may occur preferentially in a way such as to create silicon (111) sidewalls holding up the patterned dielectric layer, yet still retaining a bottom portion (100) of the silicon (100), thus defining a U-shaped groove. Such etching may be performed with potassium hydroxide (KOH), for example, which attacks the silicon sidewalls (111), until leaving the angled faces within the U-shaped grooves. As illustrated in FIG. 4E, the method 400 may continue with deposition of a buffer such as aluminum nitride (AlN) or aluminum silicide (AlSi) over the patterned dielectric and the etched, U-shaped grooves. The buffer may, therefore, bury the patterned dielectric and provide a surface on which the Group III-nitride material may be grown.

Figure 4F:
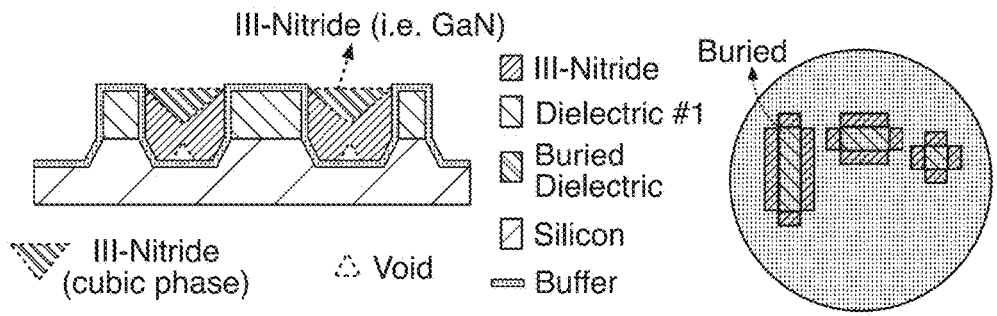

As illustrated in FIG. 4F, the method 400 may continue with deposition of the Group III-nitride material, e.g., GaN as provided by way of example herein, within the U-shaped grooves. Note that, during deposition, h-GaN grows off the angled silicon sidewalls (111) within the U-shaped grooves, and combines at merged growth fronts in the middle of the U-shaped grooves at about an angle of 109.5°. At the location of intersection or merging of these growth fronts, the h-GaN walls turn into cubic GaN (c-GaN), gradually building more c-GaN area as the h-GaN reduces and becomes buried. As will be explained, accounting for dimensions, including Group III-nitride deposition thickness, allows the present method 400 to control the amount of c-GaN growth such that the c-GaN completely covers the h-GaN on which the c-GaN is grown. This allows for exposure of a non-polarized surface using inexpensive CMOS processing steps. As will be seen, undergrowth or overgrowth may occur when not knowing ahead of time the proper thickness of the deposited gallium nitride at which deposition should cease.

Figure 5:
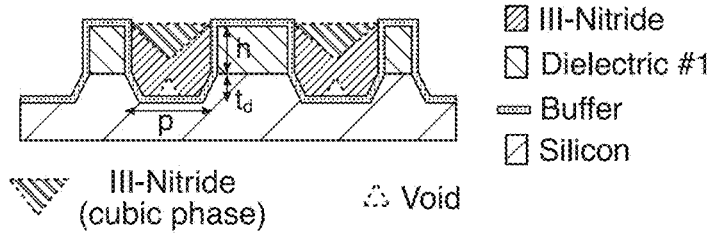
FIG. 5 is a cross-section view of a completed Group III-nitride device, according to embodiments of the present disclosure.

FIG. 5 is a cross-section view of a completed Group III-nitride device 500, according to embodiments of the present disclosure. The device 500 includes two U-shaped grooves, where one of the U-shaped grooves is marked with ideal dimensions, including a width or period (p) of the opening, an etch depth ($t_d$) of the silicon (100), and a disposition or growth thickness (h) of the Group III-nitride above the silicon (100) layer. Because these dimensions are controllable, the width of the opening of the U-shaped grooves and the etch depth may be known in advance. Accordingly, the deposition thickness (h) of the Group-III nitride (such as GaN) may be predetermined as being proportional to a difference between the width (p) of the opening of the U-shaped grooves and an etch depth ($t_d$) of the U-shaped grooves (see Equations 17 and 18, infra). With the deposition thickness (h) predetermined, the manufacturing process may be controlled to deposit only a certain amount of the Group III-nitride sufficient to reach about that thickness, h.

Figure 6:
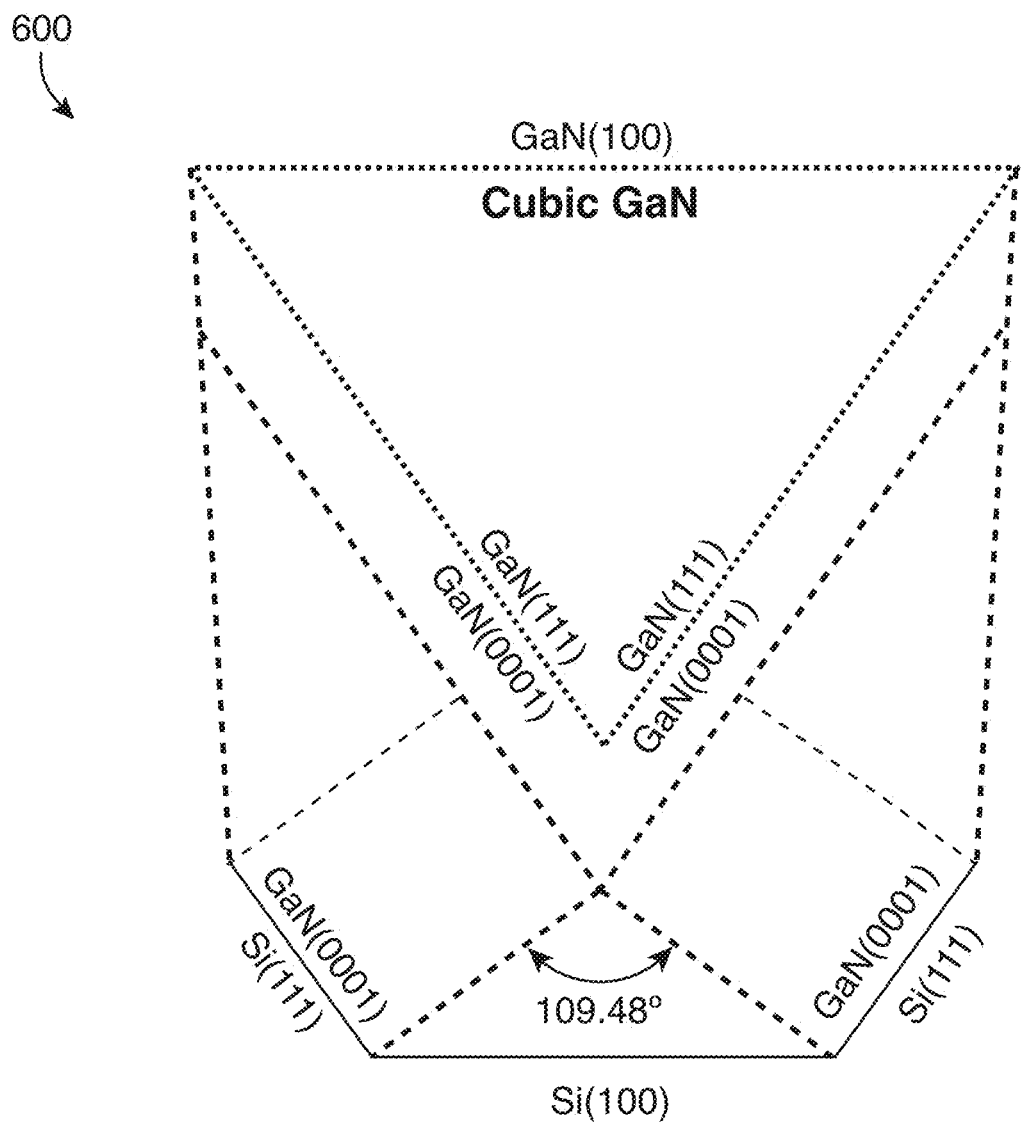
FIG. 6 is a diagram of a cross-section view of the gallium nitride (GaN) portion of a GaN device, according to embodiments of the present disclosure.
Figure 8:
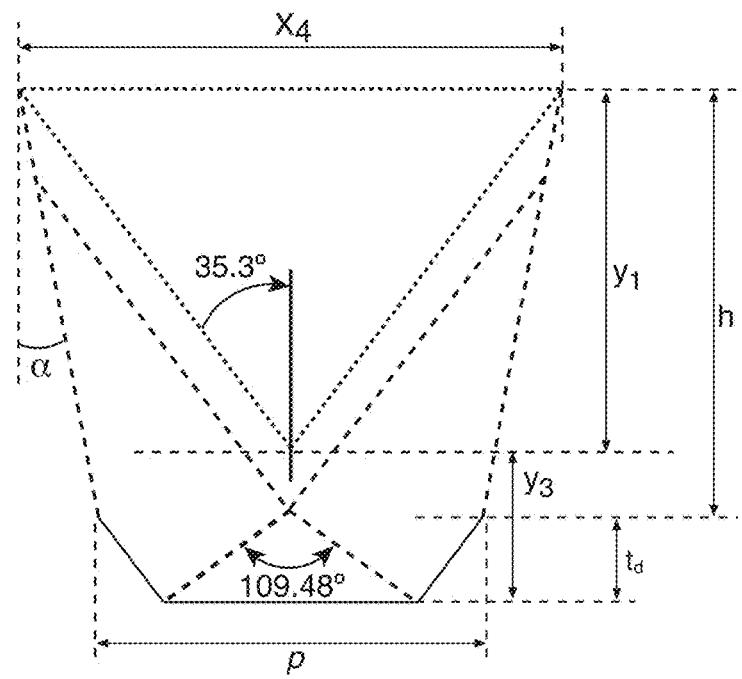
FIG. 8 is the diagram of FIG. 6 with additional illustration of an angle between complete vertical and a plane of transition between hexagonal GaN and cubic GaN within the GaN device, according to embodiments of the present disclosure.

FIG. 6 is a diagram of a cross-section view of the gallium nitride (GaN) portion 600 of a GaN device, according to embodiments of the present disclosure. Note the phase transition between hexagonal gallium nitride (h-GaN) and cubic gallium nitride (c-GaN) occurs when the middle of the <0001> h-GaN growth fronts merge. After a transition area, the c-GaN is grown, illustrated as an inverted dotted triangle, gradually becoming bigger until completely covering the h-GaN growth happening below the inverted triangle. FIG. 8 is the diagram of FIG. 6 with additional illustration of an angle (35.3 degrees) between the complete vertical and a plane of transition between hexagonal GaN and cubic GaN within the GaN device, according to embodiments of the present disclosure.

Figure 7A:
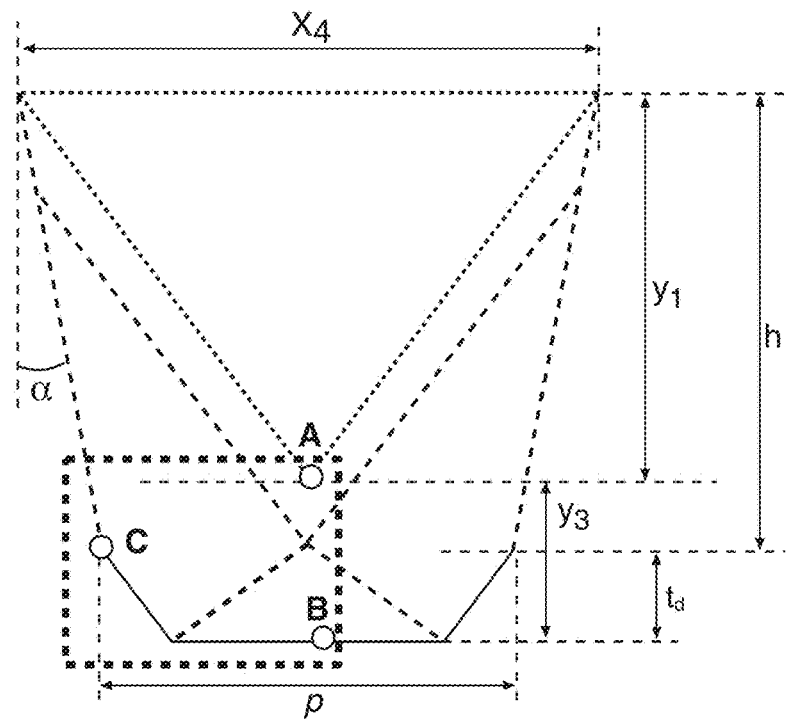
FIG. 7A is the diagram of FIG. 6 with identification of various dimensions of the GaN device, according to embodiments of the present disclosure.
Figure 7B:
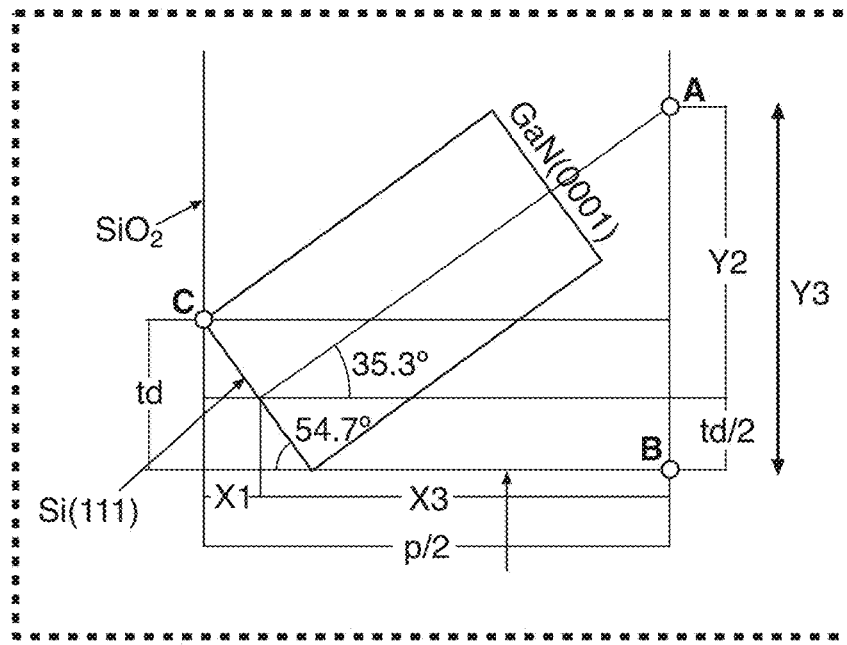
FIG. 7B is a zoomed-in view of the dashed box identified in FIG. 7A, illustrating corresponding dimensional parameters within three identified points of the GaN device, according to embodiments of the present disclosure.

FIG. 7A is the diagram of FIG. 6 with identification of various dimensions of the GaN device, according to embodiments of the present disclosure. A box in heavy dashed lines is drawn onto the diagram of FIG. 6, which includes points identified as A, B, and C. FIG. 7B is a zoomed-in view of the dashed box identified in FIG. 7A, illustrating corresponding dimensional parameters within the three identified points (A, B, C) of the GaN device, according to embodiments of the present disclosure. The crystallographic angles (54.74° between the (100) and (111) Si surfaces) are shown accordingly.

Under the selective growth conditions, the GaN nucleates on the silicon sidewalls (111) initially and these h-GaN growth fronts meet at a 109.48° angle in the middle of the U-shaped groove (e.g., at about 109.5°). After the middle of the growth fronts meet (point A), GaN grown on top will phase transition to cubic phase. Under these experimental and crystallographic observations, the geometrical modelling is carried out as follows. In the following derivation, $x_i$ and $y_i$ are various dimensions as shown in the FIGS. 7A, 7B, and 8, $h_c$ is the critical GaN deposition thickness (defined as the GaN deposition height above Si(100) that maximizes cubic phase GaN coverage on the U-groove surface), $t_d$ is the etch depth, p is the opening width, and α is the oxide sidewall angle.

From FIG. 7B, note that:

$$\tan 35.3° = \frac{y_2}{x_3} \quad (1)$$

$$\tan 54.7° = \frac{t_d}{2x_1} \quad (2)$$

$$x_1 + x_3 = \frac{p}{2} \quad (3)$$

$$y_3 = y_2 + \frac{t_d}{2} \quad (4)$$

Rearranging Equations (1), (2), and (3), results in:

$$y_2 = x_3 \tan 35.3° \quad (5)$$

$$x_1 = \frac{t_d}{2\tan 54.7°} \quad (6)$$

$$x_3 = \frac{p}{2} - x_1 \quad (7)$$

Substituting Equation (6) into Equation (7) results in:

$$x_3 = \frac{p}{2} - x_1 = \frac{p}{2} - \frac{t_d}{2\tan 54.7°} \quad (8)$$

Then using Equation (8) in Equation (5), results in:

$$y_2 = x_3 \tan 35.3° = \left(\frac{p}{2} - \frac{t_d}{2\tan 54.7°}\right)\tan 35.3° \quad (9)$$

From FIGS. 7A and 8, the following parameters may be determined:

$$x_4 = p + 2h_c \tan\alpha \quad (10)$$

$$y_1 + y_3 = h_c + t_d \quad (11)$$

$$\tan 35.3° = \frac{x_4}{2y_1} \quad (12)$$

Rearranging Equation (12) using Equation (10), and rearranging Equation (11) using Equation (4), results in the following for $y_1$ and h:

$$y_1 = \frac{x_4}{2\tan 35.3°} = \frac{p + 2h_c \tan\alpha}{2\tan 35.3°} \quad (13)$$

$$h = y_1 + y_3 - t_d = y_1 + y_2 - \frac{t_d}{2} \quad (14)$$

Substituting Equations (13) and (9) into Equation (14) results in:

$$h_c = \frac{p + 2h_c \tan\alpha}{2\tan 35.3°} + \left(\frac{p}{2} - \frac{t_d}{2\tan 54.7°}\right)\tan 35.3° - \frac{t_d}{2} \quad (15)$$

Now, solving for $h_c$, as per Equation (15), results in:

$$h_c = \left(1 - \frac{\tan\alpha}{\tan 35.3°}\right)^{-1}\left[\left(\frac{p}{2} - \frac{t_d}{2\tan 54.7°}\right)\tan 35.3° + \frac{p}{2\tan 35.3°} - \frac{t_d}{2}\right] \quad (16)$$

Simplifying and plugging in values for the tangents, results in a relationship between the critical thickness ($h_c$) and the patterning parameters, as follows:

$$h_c = \frac{[1.06p - 0.75t_d]}{\left(1 - \frac{\tan\alpha}{0.71}\right)} \quad (17)$$

When α is negligible (e.g., approximately zero), the relationship of $h_c$ simplifies to:

$$h_c = [1.06p - 0.75t_d] \quad (18)$$

Figure 9:
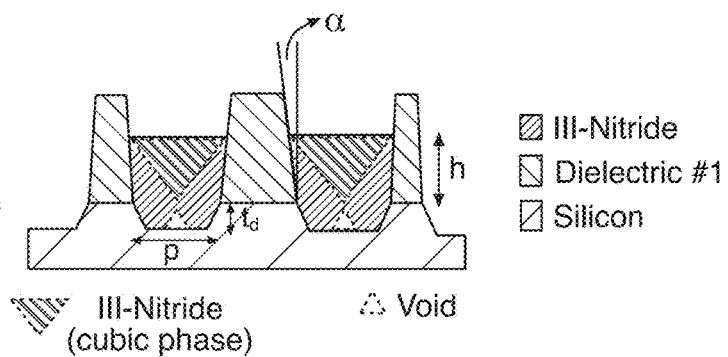
FIG. 9 is the diagram of the Group III-nitride devices of FIG. 5, according to an additional embodiment of the present disclosure.

FIG. 9 is the diagram of the Group III-nitride devices of FIG. 5, according to an additional embodiment of the present disclosure. In this embodiment, the angle, α, is illustrated to represent an angle between a vertical plane orthogonal to the silicon (100) layer and the actual vertical sidewall of the patterned dielectric (which is often not completely vertical). The additional dimensional parameters, including the width (p) of the opening of the U-shaped groove, the etch depth ($t_d$) of the silicon (100) layer, and the deposition thickness (h) of the Group-III nitride above the silicon (100) layer may also be optimized as illustrated in FIG. 9, such that h is as close as possible to $h_c$ in the above Equation (17).

Figure 10A:
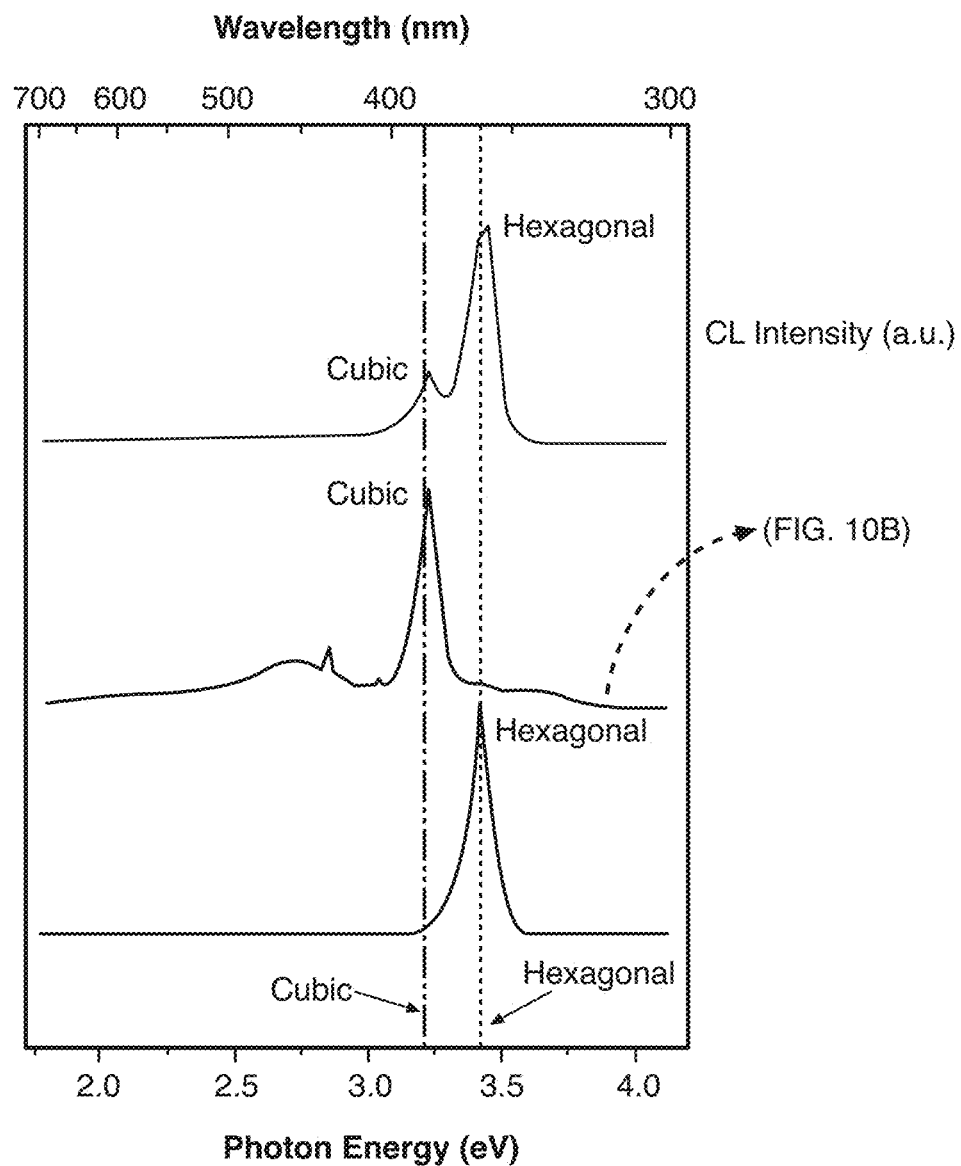
FIG. 10A is a graph illustrating cathodoluminescence (CL) of a range of photon energy within the GaN device formed through optimization of the method of FIGS. 4A-4F, according to an embodiment of the present disclosure.

FIG. 10A is a graph illustrating cathodoluminescence (CL) of a range of photon energy within the GaN device formed through optimization of the method of FIGS. 4A-4F, according to an embodiment of the present disclosure. Note that the wavelength in nanometers (nm) at the top indicates that the c-GaN material produces light at about 390 nm (ultraviolet), whereas the h-GaN material produces light at a slightly shorter wavelength, about 360 nm.

Figure 10B:
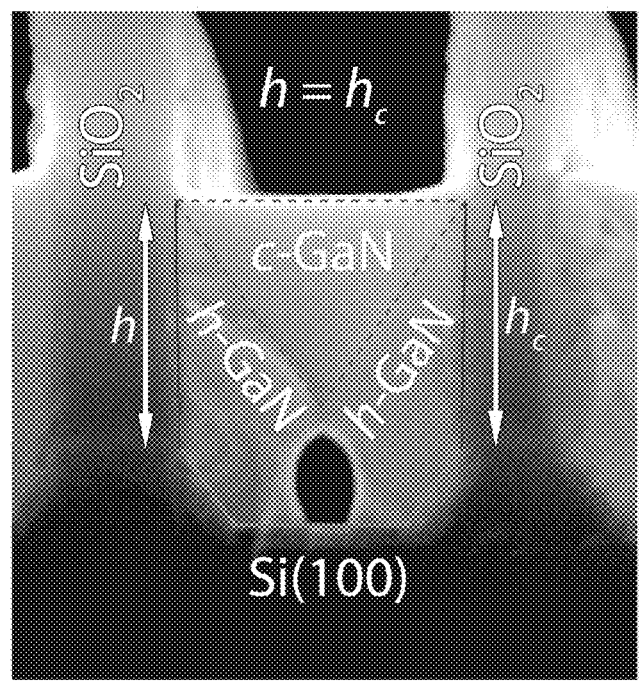
FIG. 10B is a scanning electron microscope (SEM) image of the GaN device corresponding to the graph of FIG. 10A, according to an embodiment of the present disclosure.

FIG. 10B is a scanning electron microscope (SEM) image of the GaN device corresponding to the graph of FIG. 10A, according to an embodiment of the present disclosure. Given an opening width of p≈315 nm, a dioxide sidewall angle of α≈4°, and an etch depth of $t_d$≈75 nm, Equation (17) yields an ideal deposition thickness $h_c$≈300 nm, which is very close to the case here where the actual deposition thickness was h≈290 nm. This has the strongest cubic phase GaN signal with no hexagonal phase GaN mixed in. Accordingly, as illustrated in FIG. 10B, the c-GaN completely covers the underlying h-GaN deposition.

Figure 10C:
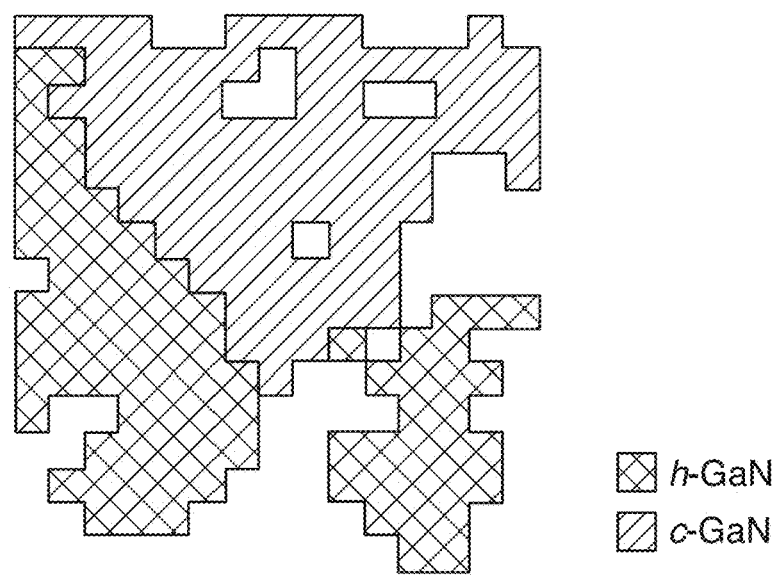
FIG. 10C is a side view of electron backscatter diffraction (EBSD) image of the GaN device illustrated in FIG. 10B, according to an embodiment of the present disclosure.

FIG. 10C is a side view of electron backscatter diffraction (EBSD) image of the GaN device illustrated in FIG. 10B, according to an embodiment of the present disclosure. Note that there is no h-GaN at the surface of the GaN device, only c-GaN, as predicted in the optimized case.

Figure 11A:
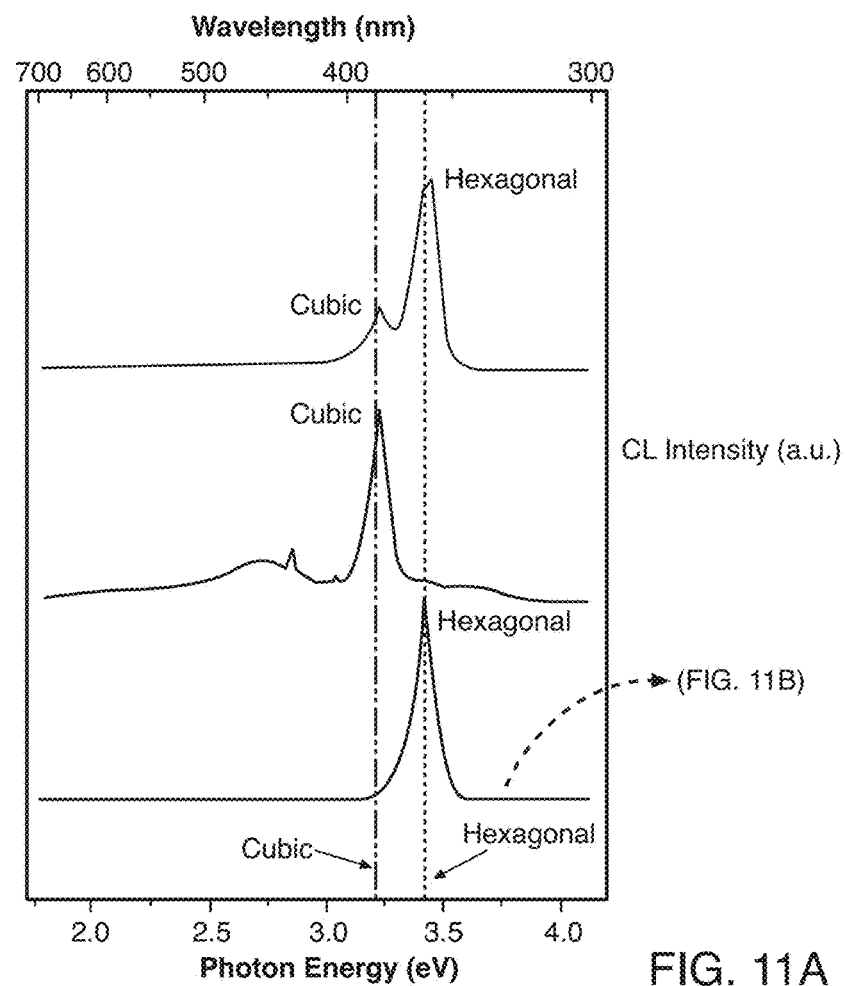
FIG. 11A is a graph illustrating CL of a range of photon energy within a GaN device formed through non-optimization of the method of FIGS. 4A-4F, in which there has been undergrowth of the cubic phase GaN, according to an embodiment of the present disclosure.
Figure 11B:
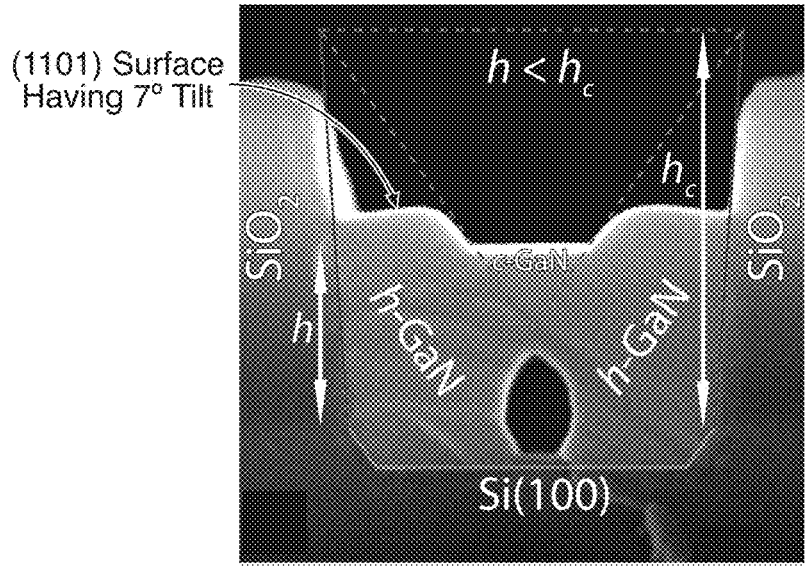
FIG. 11B is a SEM image of the GaN device corresponding to the graph of FIG. 11A, according to an embodiment of the present disclosure.

FIG. 11A is a graph illustrating CL of a range of photon energy within a GaN device formed through non-optimization of the method of FIGS. 4A-4F, in which there has been undergrowth of the cubic phase GaN, according to an embodiment of the present disclosure. FIG. 11B is a SEM image of the GaN device corresponding to the graph of FIG. 11B, according to an embodiment of the present disclosure. Given an opening width of p≈720 nm, a dioxide sidewall angle α≈5°, an etch depth of $t_d$≈86 nm, the ideal deposition thickness would be $h_c$≈215 nm. The actual deposition height, however, was measured at 172 nm. Accordingly, the CL signal is composed of almost entirely hexagonal phase GaN, as only a small portion in the middle has been grown as cubic phase GaN. The (1101) plane of the hexagonal phase GaN can be seen forming a 7° angle to the silicon substrate. Accordingly, in the example of FIGS. 11A-11B, more deposition would be needed to maximize the cubic phase of the GaN on the device surface.

Figure 12A:
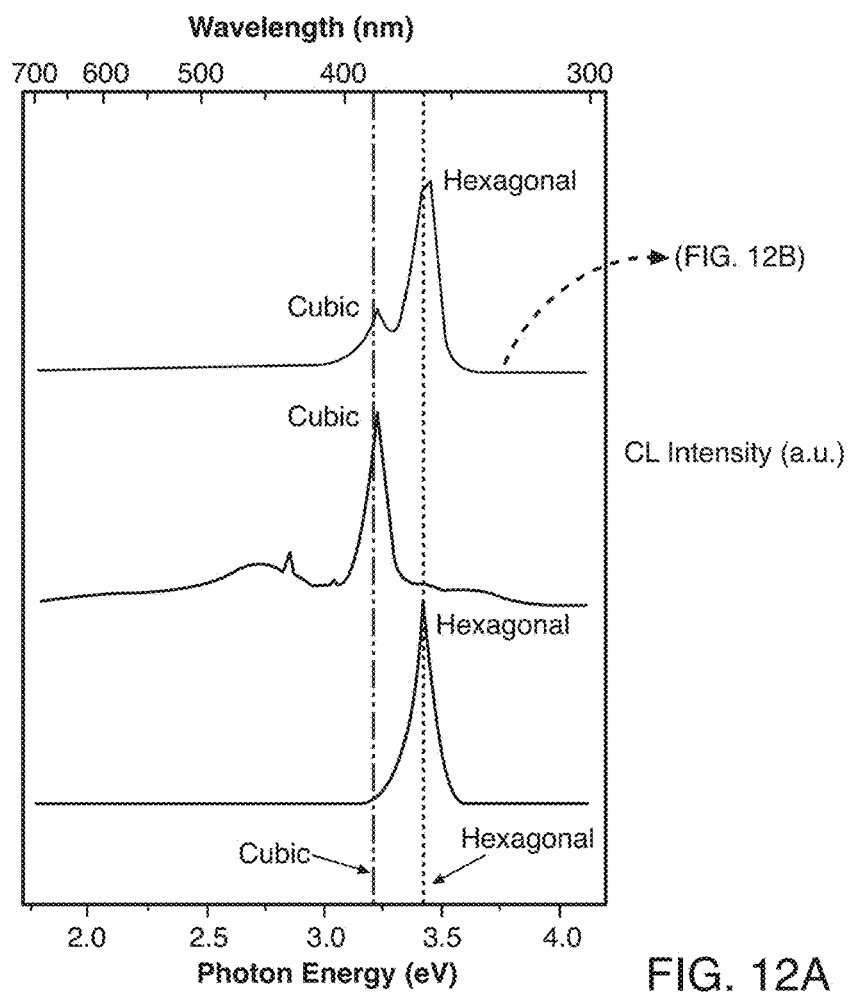
FIG. 12A is a graph illustrating CL of a range of photon energy within a GaN device formed through non-optimization of the method of FIGS. 4A-4F, in which there has been overgrowth back into hexagonal phase GaN, according to an embodiment of the present disclosure.
Figure 12B:
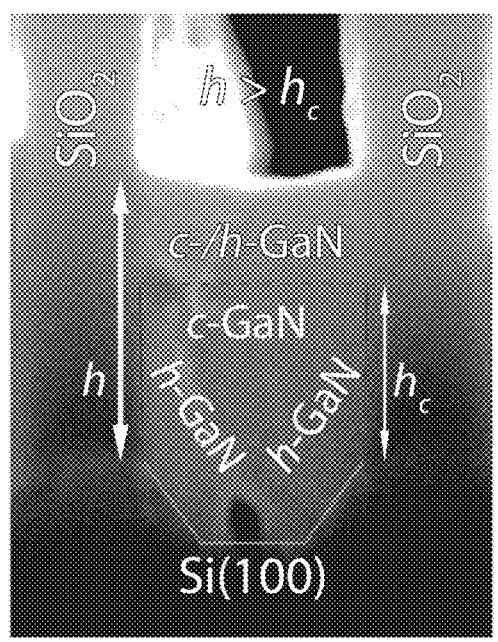
FIG. 12B is a SEM image of the GaN device corresponding to the graph of FIG. 12A, according to an embodiment of the present disclosure.

FIG. 12A is a graph illustrating CL of a range of photon energy within a GaN device formed through non-optimization of the method of FIGS. 4A-4F, in which there has been overgrowth back into hexagonal phase GaN, according to an embodiment of the present disclosure. FIG. 12B is a SEM image of the GaN device corresponding to the graph of FIG. 12B, according to an embodiment of the present disclosure. Given an opening width of p≈240 nm, a dioxide sidewall angle α≈0°, and an etch depth of $T_d$≈60 nm, the ideal deposition thickness would be $h_c$≈215 nm. The actual deposition height of 240 nm is about 25 nm too much. Accordingly, the CL signal indicates the presence of hexagonal phase GaN mixed with cubic phase GaN. No clear crystal planes are distinguishable due to the over-growth of deposited GaN. Accordingly, in the example of FIGS. 12A-12B, less deposition would be needed to maximize the cubic phase of the GaN on the device surface.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. A device including a non-polarization material comprising:
    a first layer of silicon (100) defining a U-shaped groove having a bottom portion (100) and silicon sidewalls (111) at an angle to the bottom portion (100);
    a second layer of a patterned dielectric on top of the silicon (100) to define vertical sidewalls of the U-shaped groove;
    a third layer of a buffer covering the first layer and the second layer; and
    a fourth layer of gallium nitride deposited on the buffer within the U-shaped groove, the fourth layer including cubic gallium nitride (c-GaN) formed at merged growth fronts of hexagonal gallium nitride (h-GaN) that extend from the silicon sidewalls (111), wherein a deposition thickness (h) of the gallium nitride above the first layer of silicon (100) is such that the c-GaN completely covers the h-GaN between the vertical sidewalls.

2. The device of claim 1, wherein the patterned dielectric comprises one of silicon dioxide or silicon nitride and the buffer comprises one of aluminum nitride and aluminum silicide.

3. The device of claim 1, wherein the deposition thickness (h) of the gallium nitride is set proportional to a difference between a width (p) of an opening of the U-shaped groove and an etch depth ($t_d$) of the silicon (100).

4. The device of claim 3, wherein a sidewall angle (α) is formed between the vertical sidewalls and a plane that is orthogonal to the first layer, and wherein the deposition thickness (h) of the cubic gallium nitride is $$h = \frac{[1.06p - 0.75t_d]}{\left(1 - \frac{\tan\alpha}{0.71}\right)}.$$

5. The device of claim 1, wherein an angle between the merged growth fronts of the h-GaN that extend from the silicon sidewalls (111) is about 109.5 degrees.

6. An integrated device including a group of layers comprising:
    a first layer of silicon (100) defining a U-shaped groove having a bottom portion (100) and silicon sidewalls (111) at an angle to the bottom portion (100);
    a second layer of a patterned dielectric on top of the silicon (100) to define vertical sidewalls of the U-shaped groove;
    a third layer of a buffer covering the first layer and the second layer; and
    a fourth layer of a material, having both hexagonal and cubic phases, deposited on the buffer within the U-shaped groove, the fourth layer including a cubic phase of the material formed at merged growth fronts of the material in hexagonal phase that extend from the silicon sidewalls (111), wherein a deposition thickness (h) of the material above the first layer of silicon (100) is such that the cubic phase of the material completely covers the hexagonal phase of the material between the vertical sidewalls.

7. The device of claim 6, wherein the material is one of gallium nitride, aluminum nitride, and indium nitride.

8. The device of claim 6, wherein the patterned dielectric comprises silicon dioxide and the buffer comprises one of aluminum nitride or aluminum silicide.

9. The device of claim 6, wherein the deposition thickness (h) of the material is set proportional to a difference between a width (p) of an opening of the U-shaped groove and an etch depth ($t_d$) of the silicon (100).

10. The device of claim 9, wherein a sidewall angle (α) is formed between the vertical sidewalls and a plane that is orthogonal to the first layer, and wherein the deposition thickness (h) of the material in cubic phase is $$h = \frac{[1.06p - 0.75t_d]}{\left(1 - \frac{\tan\alpha}{0.71}\right)}.$$

11. The device of claim 6, wherein an angle between the merged growth fronts of the material in hexagonal phase that extend from the silicon sidewalls (111) is about 109.5 degrees.

* * * * *